(12) United States Patent
Yu et al.

(10) Patent No.: US 12,129,185 B2
(45) Date of Patent: Oct. 29, 2024

(54) ALPHA-PHASE NICKEL HYDROXIDE AND PREPARATION METHOD AND USE THEREOF

(71) Applicant: Fuzhou University, Fujian (CN)

(72) Inventors: Yan Yu, Fujian (CN); Zanyong Zhuang, Fujian (CN); Linxin Zhou, Fujian (CN); Bixia Yang, Fujian (CN)

(73) Assignee: Fuzhou University, Fujian (CN)

( * ) Notice: Subject to any disclaimer, the term of this patent is extended or adjusted under 35 U.S.C. 154(b) by 189 days.

(21) Appl. No.: 17/846,266

(22) Filed: Jun. 22, 2022

(65) Prior Publication Data
US 2023/0339773 A1 Oct. 26, 2023

(30) Foreign Application Priority Data
Apr. 21, 2022 (CN) .......................... 202210421826.X

(51) Int. Cl.
C01G 53/08 (2006.01)
C30B 7/06 (2006.01)
C30B 7/14 (2006.01)

(52) U.S. Cl.
CPC ............... C01G 53/08 (2013.01); C30B 7/06 (2013.01); C30B 7/14 (2013.01); C01P 2002/22 (2013.01); C01P 2006/40 (2013.01)

(58) Field of Classification Search
CPC ........ C01G 51/04; C01G 53/04; C01G 53/08; C01P 2002/22; C01P 2006/40; C30B 7/06; C30B 7/14; Y02E 60/36
See application file for complete search history.

(56) References Cited

U.S. PATENT DOCUMENTS

2015/0295231 A1* 10/2015 Kase ..................... H01M 4/366
429/223

FOREIGN PATENT DOCUMENTS

CN 111889104 A * 11/2020 ......... B01D 53/8671

OTHER PUBLICATIONS

Zul et. al., "A review on the utilization of calcium oxide as a base catalyst in biodiesel production." Journal of Environmental Chemical Engineering 9 (2021) 105741 (Year: 2021).*
Yang et al., "Methanol promoted synthesis of porous hierarchical α-Ni(OH)2 for the removal of Congo red," Powder Technology 320 (2017) 377-385 (Year: 2017).*

* cited by examiner

*Primary Examiner* — Hua Qi
(74) *Attorney, Agent, or Firm* — Laurence A. Greenberg; Werner H. Stemer; Ralph E. Locher

(57) ABSTRACT

Disclosed is an α-phase nickel hydroxide and a preparation method and use thereof. The method for preparing an α-phase nickel hydroxide comprises the following steps: subjecting a biomass calcium source to a calcination to obtain a porous calcium oxide; under a protective atmosphere, mixing the porous calcium oxide with a first methanol-ethanol solvent to obtain a calcium oxide heterogeneous solution; under a protective atmosphere, mixing the calcium oxide heterogeneous solution with a nickel source homogeneous solution to obtain a mixture, and subjecting the mixture to a coprecipitation to obtain a nickel calcium hydroxide precursor, wherein the nickel source homogeneous solution is prepared with a nickel source containing crystal water as a solute and a second methanol-ethanol solvent as a solvent; and subjecting the nickel calcium hydroxide precursor to a calcium hydroxide removal treatment to obtain the α-phase nickel hydroxide.

8 Claims, 6 Drawing Sheets

ALPHA-PHASE NICKEL HYDROXIDE AND PREPARATION METHOD AND USE THEREOF

CROSS REFERENCE TO RELATED APPLICATION

This patent application claims the benefit and priority of Chinese Patent Application No. 202210421826.X, entitled "Alpha-phase nickel hydroxide and preparation method and use thereof" filed on Apr. 21, 2022, the disclosure of which is incorporated by reference herein in its entirety as part of the present application.

TECHNICAL FIELD

The present disclosure relates to the technical field of materials, and in particular to an α-phase nickel hydroxide and a preparation method and use thereof.

BACKGROUND ART

In recent years, α-Ni(OH)$_2$ has been widely studied because of its excellent performance and stability in electrocatalysis and photocatalysis. In addition, α-Ni(OH)$_2$ has great research and application potentials in the field of catalysis because of its large specific surface area.

However, α-Ni(OH)$_2$ has poor stability in strong alkali and is easy to change into β-Ni(OH)$_2$. At present, the most common method for stabilizing α-Ni(OH)$_2$ structure is doping one or more metal elements, such as Mn, Al, Y, Fe, Co, Zn, Al/Y, and Al/Co—Y—Zn. The mechanism of this method is that nickel ions are partially replaced by trivalent or divalent metal ions to increase the number of positive charges between NiO$_2$ layers of crystal, so as to increase the number of anions (such as $CO_3^{2-}$, $NO_3^-$, and $OH^-$) embedded between NiO$_2$ layers and bonding force, ensuring that interlayer anions and water molecules are not extruded which would otherwise results in a collapse of α-Ni(OH)$_2$ layered structure, thereby making lattice constants stable and a phase transition not easy to occur.

The existing methods for preparing α-Ni(OH)$_2$ mainly include a hydrothermal method, which needs a reactor under conditions of high-temperature and high-pressure, and an auxiliary agent such as urea or other substances. During the hydrothermal method for preparing α-Ni(OH)$_2$, it is necessary to strictly control factors that have a significant effect on the structural stability of α-Ni(OH)$_2$, such as reaction time, temperature, pH value of solution, and type and addition mode of an additive. Thus, the hydrothermal method has a complex process. Therefore, it is of great significance to develop a simple method for preparing α-Ni(OH)$_2$ having stable structure.

SUMMARY

An object of the present disclosure is to provide an α-phase nickel hydroxide and a preparation method and use thereof. The method provided by the present disclosure makes it possible to prepare α-Ni(OH)$_2$ with stable structure by controlling type of solvent, has a simple process, uses biomass calcium source as a raw material and is low-cost.

In order to achieve the above object, the present disclosure provides the following technical solutions.

The present disclosure provides a method for preparing an α-phase nickel hydroxide, comprising the following steps:

subjecting a biomass calcium source to a calcination to obtain a porous calcium oxide;

under a protective atmosphere, mixing the porous calcium oxide with a first methanol-ethanol solvent to obtain a calcium oxide heterogeneous solution;

under a protective atmosphere, mixing the calcium oxide heterogeneous solution with a nickel source homogeneous solution to obtain a mixture, and subjecting the mixture to a coprecipitation to obtain a nickel calcium hydroxide precursor, wherein the nickel source homogeneous solution is prepared with a nickel source containing crystal water as a solute and a second methanol-ethanol solvent as a solvent; and subjecting the nickel calcium hydroxide precursor to a calcium hydroxide removal treatment to obtain the α-phase nickel hydroxide.

In some embodiments, the first methanol-ethanol solvent and the second methanol-ethanol solvent independently have a volume ratio of methanol to ethanol of 1:0.1 to 1:10.

In some embodiments, the biomass calcium source comprises one or more selected from the group consisting of oyster shell, clam shell and egg shell.

In some embodiments, the calcination is performed at a temperature of 900-1200° C. for 0.5-3 h.

In some embodiments, a mass ratio of the porous calcium oxide to the nickel source containing crystal water is in a range of 1:0.1 to 1:250.

In some embodiments, the coprecipitation is performed under stirring at a speed of 500-1000 rpm for 1-48 h.

In some embodiments, the calcium hydroxide removal treatment comprises removing calcium hydroxide by using a dilute hydrochloric acid.

In some embodiments, the dilute hydrochloric acid has a hydrochloric acid concentration of 0.1-1 mol/L; and a ratio of a mass of the nickel calcium hydroxide precursor to a number of moles of hydrochloric acid in the dilute hydrochloric acid is in a range of 1 g:(4-200) mmol.

The present disclosure further provides an α-phase nickel hydroxide obtained by the method as described in the above technical solutions, wherein the α-phase nickel hydroxide has a porous two-dimensional structure formed by α-phase nickel hydroxide nanosheets having a thickness of 10-20 nm.

The present disclosure provides use of the α-phase nickel hydroxide as described in the above technical solutions as a catalyst.

The present disclosure provides a method for preparing an α-phase nickel hydroxide, comprising the following steps: subjecting a biomass calcium source to a calcination to obtain a porous calcium oxide; under a protective atmosphere, mixing the porous calcium oxide with a first methanol-ethanol solvent to obtain a calcium oxide heterogeneous solution; under a protective atmosphere, mixing the calcium oxide heterogeneous solution with a nickel source homogeneous solution to obtain a mixture, and subjecting the mixture to a coprecipitation to obtain a nickel calcium hydroxide precursor, wherein the nickel source homogeneous solution is prepared with a nickel source containing crystal water as a solute and a second methanol-ethanol solvent as a solvent; and subjecting the nickel calcium hydroxide precursor to a calcium hydroxide removal treatment to obtain the α-phase nickel hydroxide. In the present disclosure, the porous calcium oxide is used as a template; under the protective atmosphere and in the methanol-ethanol solvent system, a reaction between methanol and calcium oxide would enable massive porous calcium oxide to be transformed to a certain flake structure; the addition of ethanol improves the crystallinity of the α-phase nickel hydroxide, and the porous calcium oxide is hydrated with the crystal water in the nickel source to form calcium hydroxide; meanwhile, due to the existence of divalent nickel ions with lower solubility product in the solution, the formed calcium hydroxide would immediately compound with nickel ions to form nickel calcium hydroxide precursor (α-Ni(OH)$_2$/Ca(OH)$_2$), and then calcium hydroxide is removed by a sacrificial template method to obtain α-Ni(OH)$_2$ with porous two-dimensional structure and high structural stability. The method provided by the present disclosure has advantages of simple process and easy operation. Moreover, in the present disclosure, the biomass calcium source is used, which is a raw material from wide sources, and is low-cost. Further, the method is highly applicable, green, and environmentally friendly, could realize a large-scale industrial production, and has good economic and environmental benefits.

The present disclosure provides an α-phase nickel hydroxide obtained by the method as described in the above technical solutions, wherein the α-phase nickel hydroxide has a porous two-dimensional structure formed by α-phase nickel hydroxide nanosheets having a thickness of 10-20 nm. The α-phase nickel hydroxide provided by the present disclosure has large specific surface area, and high catalytic activity and selectivity as a catalyst for the reduction of $CO_2$ to produce CO and $H_2$.

DETAILED DESCRIPTION OF THE EMBODIMENTS

Figure 1:
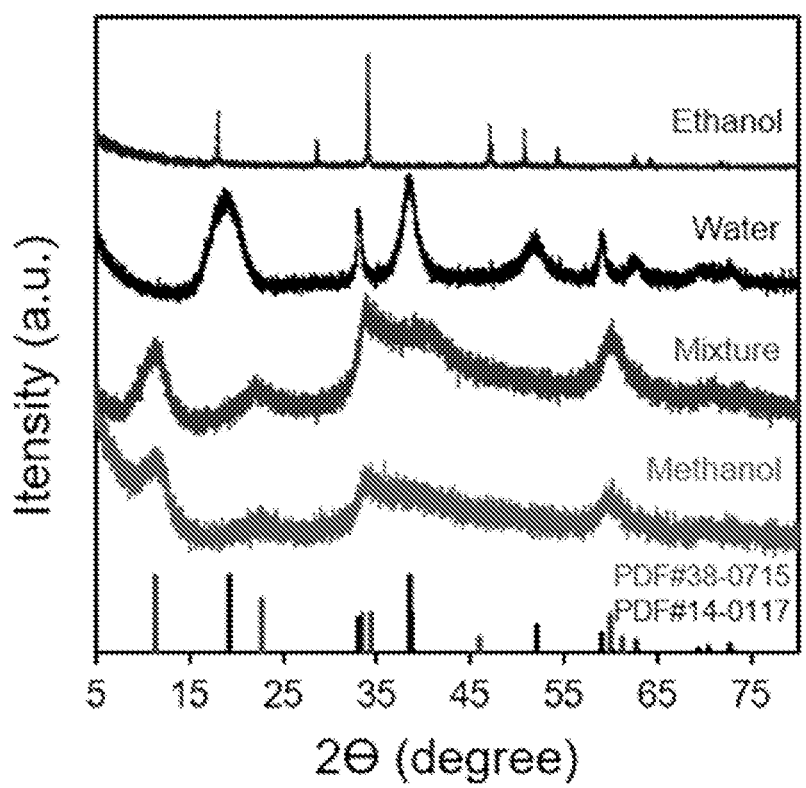
FIG. 1 shows X-ray diffraction (XRD) patterns of α-Ni(OH)$_2$ prepared according to Example 1 (Mixture) and Example 4 (Methanol), β-Ni(OH)$_2$ nano material prepared according to Comparative Example 1 (Water), and Ca(OH)$_2$ prepared according to Comparative Example 2 (Ethanol).

The present disclosure provides a method for preparing an α-phase nickel hydroxide, comprising the following steps:

subjecting a biomass calcium source to a calcination to obtain a porous calcium oxide;

under a protective atmosphere, mixing the porous calcium oxide with a first methanol-ethanol solvent to obtain a calcium oxide heterogeneous solution;

under a protective atmosphere, mixing the calcium oxide heterogeneous solution with a nickel source homogeneous solution to obtain a mixture, and subjecting the mixture to a coprecipitation to obtain a nickel calcium hydroxide precursor, wherein the nickel source homogeneous solution is prepared with a nickel source containing crystal water as a solute and a second methanol-ethanol solvent as a solvent; and subjecting the nickel calcium hydroxide precursor to a calcium hydroxide removal treatment to obtain the α-phase nickel hydroxide.

In the present disclosure, all raw materials are commercially available goods well known to those skilled in the art, unless otherwise specified.

In the present disclosure, the biomass calcium source is subjected to a calcination to obtain the porous calcium oxide.

In some embodiments, the biomass calcium source comprises one or more selected from the group consisting of oyster shell, clam shell and egg shell. In some embodiments, the biomass calcium source is firstly subject to a washing, a drying, a crushing and a sieving in sequence to obtain a sieved biomass calcium source, and then the sieved biomass calcium source (biomass calcium source powder) is subjected to the calcination. In some embodiments, the drying is performed at a temperature of 50-100° C., preferably 60-90° C., and more preferably 70-80° C. In the present disclosure, there is no special limitation on a time for drying, as long as the biomass calcium source could be dried to have a constant weight, for example, the time for drying may be 2-8 h, preferably 4-6 h. In the present disclosure, there is no special limitation on the mode of crushing, and any mode for crushing well known to those skilled in the art may be used, such as grinding which would make a marine biomass shell powder have a size of preferably not greater than 120 meshes. In some embodiments, a sieve size for the sieving is 120 meshes.

In some embodiments, the calcination is performed at a calcination temperature of 900-1200° C., preferably 950-1150° C., more preferably 1000-1100° C. In some embodiments, a heating rate from ambient temperature to the calcination temperature is in a range of 5-20° C./min, preferably 10-15° C./min. In some embodiments, the calcination is performed at the calcination temperature for 0.5-3 h, preferably 1-2.5 h, more preferably 1.5-2 h. In some embodiments, the calcination is performed in air.

In some embodiments, after the calcination, the method further comprises subjecting the calcined product to a cooling to ambient temperature, a crushing and a sieving to obtain the porous calcium oxide. In the present disclosure, there is no special limitation on the mode of crushing, and any mode for crushing well known to those skilled in the art may be used, such as grinding which would make a marine biomass shell powder have a size of preferably not greater than 120 meshes. In some embodiments, a sieve size for the sieving is 120 meshes.

In the present disclosure, after obtaining the porous calcium oxide, under a protective atmosphere, the porous calcium oxide is mixed with the first methanol-ethanol solvent to obtain the calcium oxide heterogeneous solution.

In the present disclosure, there is no special limitation on the protective atmosphere, and any protective atmosphere well known to those skilled in the art may be used, such as nitrogen gas or inert gas, wherein in some embodiments, the inert gas is selected from the group consisting of argon gas or helium gas.

In some embodiments, the first methanol-ethanol solvent has a volume ratio of methanol to ethanol of 1:0 to 1:10, preferably 1:0.1 to 1:8, more preferably 1:1 to 1:5.

In some embodiments, the calcium oxide heterogeneous solution has a calcium oxide concentration of 1-50 g/L, preferably 5-30 g/L, more preferably 10-20 g/L. In some embodiments, the mixing is performed under stirring. In some embodiment, the stirring is performed at a speed of 500-1000 rpm, preferably 600-900 rpm, more preferably 700-800 rpm. In some embodiments, the stirring is performed for 30-60 min, preferably 40-50 min, more preferably 40-45 min. In some embodiments, the mixing is performed at a temperature of 20-50° C., preferably 20-30° C. In a specific embodiment of the present disclosure, the mixing is performed at ambient temperature.

In the present disclosure, after obtaining the calcium oxide heterogeneous solution, under a protective atmosphere, the calcium oxide heterogeneous solution is mixed with the nickel source homogeneous solution to obtain a mixture, and the mixture was subjected to a coprecipitation to obtain the nickel calcium hydroxide precursor; wherein the nickel source homogeneous solution is prepared with the nickel source containing crystal water as a solute and the second methanol-ethanol solvent as a solvent.

In some embodiments, the nickel source homogeneous solution is prepared by dissolving the nickel source containing crystal water in the second methanol-ethanol solvent. In some embodiments, the nickel source containing crystal water comprises one or more selected from the group consisting of nickel chloride hexahydrate, nickel sulfate hexahydrate and nickel nitrate hexahydrate. In some embodiment, the second methanol-ethanol solvent has a volume ratio of methanol to ethanol of 1:0 to 1:10, preferably 1:0.1 to 1:8, more preferably 1:1 to 1:5. In some embodiments, the nickel source homogeneous solution has a concentration of 3-170 g/L, preferably 20-100 g/L, more preferably 30-50 g/L. In some embodiments, the dissolving is performed under stirring. In some embodiments, the stirring is performed at a speed of 500-1000 rpm, preferably 600-900 rpm, more preferably 700-800 rpm. In some embodiments, the stirring is performed for 30-60 min, preferably 40-50 min, more preferably 40-45 min. In some embodiments, the dissolving is performed at a temperature of 20-50° C., more preferably 20-30° C. In one specific embodiment of the present disclosure, the dissolving is performed at ambient temperature.

In some embodiments, the protective atmosphere in the step of obtaining the nickel calcium hydroxide precursor is the same as the protective atmosphere in the step of obtaining the calcium oxide heterogeneous solution, which will not be repeated here.

In some embodiments, a mass ratio of the porous calcium oxide in the calcium oxide heterogeneous solution to the nickel source containing crystal water in the nickel source homogeneous solution is in a range of 1:0.1 to 1:250, preferably 1:1 to 1:200, more preferably 1:2 to 1:50, most preferably 1:3 to 1:10.

In some embodiments, the coprecipitation is performed under stirring. In some embodiments, the stirring is performed at a speed of 500-1000 rpm, preferably 600-900 rpm, more preferably 700-800 rpm. In some embodiments, the stirring is performed for 1-48 h, preferably 2-40 h, more preferably 3-20 h. In some embodiments, the coprecipitation is performed at a temperature of 20-50° C., preferably 20-30° C. In one specific embodiment of the present disclosure, the coprecipitation is performed at ambient temperature.

In some embodiments, after the coprecipitation, the obtained coprecipitation system is further subjected to a solid-liquid separation to obtain a solid product, and the solid product is subjected to a washing and a drying in sequence to obtain the nickel calcium hydroxide precursor. In the present disclosure, there is no special limitation on the mode of the solid-liquid separation, and any mode of solid-liquid separation well known to those skilled in the art may be used, such as centrifugal separation. In some embodiments, the centrifugal separation is performed at a rotational speed of 8000-10000 rpm, preferably 9000 rpm. In some embodiment, the centrifugal separation is performed for 3-5 min, preferably 4 min. In some embodiment, the centrifugal separation is performed by a centrifuge. In some embodiment, the washing is performed by ethanol, and in some embodiment for 2-4 times, more preferably 3 times. In some embodiment, the drying is a freeze-drying. In some embodiments, the freeze-drying is performed at a temperature of −60 to −50° C., more preferably −55 to −53° C. In the present disclosure, there is no special limitation on the time for the freeze-drying, and as long as the product could be freeze-dried to have a constant weight. For example, the time for the freeze-drying may be 6-12 h, preferably 8-10 h.

In the present disclosure, after obtaining the nickel calcium hydroxide precursor, the nickel calcium hydroxide precursor is subjected to a calcium hydroxide removal treatment to obtain the α-phase nickel hydroxide. In some embodiment, the calcium hydroxide removal treatment includes removing calcium hydroxide with dilute hydrochloric acid. In some embodiments, the dilute hydrochloric acid has a concentration of 0.1-1 mol/L, more preferably 0.1-0.5 mol/L. In some embodiments, the ratio of the mass of the nickel calcium hydroxide precursor to the number of moles of hydrochloric acid in the dilute hydrochloric acid is in a range of 1 g:(5-100) mmol, preferably 1 g:(10-50) mmol.

In some embodiments, after the calcium hydroxide treatment, the obtained reaction system is further subjected to a solid-liquid separation to obtain a solid product, and the solid product is subjected to a washing and a drying in sequence to obtain the α-phase nickel hydroxide. In the present disclosure, there is no special limitation on the mode of the solid-liquid separation, and any mode of solid-liquid separation well known to those skilled in the art may be used, such as centrifugal separation. In some embodiments, the centrifugal separation is performed at a rotational speed of 8000-10000 rpm, preferably 9000 rpm. In some embodiment, the centrifugal separation is performed for 3-5 min, preferably 4 min. In some embodiment, the centrifugal separation is performed by a centrifuge. In some embodiment, the washing is performed by ethanol, and in some embodiment for 2-4 times, more preferably 3 times. In some embodiment, the drying is a freeze-drying. In some embodiments, the freeze-drying is performed at a temperature of −60 to −50° C., more preferably −55 to −53° C. In the present disclosure, there is no special limitation on the time for the freeze-drying, and as long as the product could be freeze-dried to have a constant weight. For example, the time for the freeze-drying may be 6-12 h, preferably 8-10 h.

The present disclosure provides an α-phase nickel hydroxide obtained by the method as described in the above technical solutions, wherein the α-phase nickel hydroxide has a porous two-dimensional structure formed by α-phase nickel hydroxide nanosheets having a thickness of 10-20 nm, preferably 12-15 nm.

The present disclosure provides use of the α-phase nickel hydroxide as described in the above technical solutions as a catalyst or an electrode material. In some embodiment, the α-phase nickel hydroxide is used as a catalyst for the reduction of $CO_2$ to produce CO and $H_2$.

In the present disclosure, a method for catalyzing the reduction of $CO_2$ to produce CO and $H_2$ by the α-phase nickel hydroxide comprises the following steps:

mixing the α-phase nickel hydroxide, a solvent and tris(2,2'-bipyridine)ruthenium(II) chloride hexahydrate to obtain a mixture, introducing $CO_2$ to the mixture, and then subjecting the mixture to a catalytic reduction reaction to obtain CO and $H_2$.

In some embodiments, the solvent is a mixed solvent comprising water, a nitrile solvent and an alcohol amine solvent. In some embodiments, the nitrile solvent comprises acetonitrile. In some embodiments, the alcohol amine solvent comprises triethanolamine. In some embodiments, a volume ratio of water to the nitrile solvent to the alcohol amine solvent in the mixed solvent is in a range of 1:(1-5):(1-5), preferably 1:(2-4):(2-4), more preferably 1:3:1.

In some embodiments, a mass ratio of the α-phase nickel hydroxide to tris(2,2'-bipyridine)ruthenium(II) chloride hexahydrate is in a range of 1:(1-30), preferably 1:8.

In some embodiments, a ratio of a mass of the α-phase nickel hydroxide to a pressure of $CO_2$ is in a range of 1 mg:(0.5-3) atm, preferably 1 mg:(1-2) atm.

In some embodiments, the catalytic reduction reaction is performed under the irradiation of a xenon lamp. In some embodiments, a radiation power of the xenon lamp is in a range of 220-450 W, preferably 300-400 W. In some embodiments, the catalytic reduction reaction is performed at a temperature of 20-35° C., more preferably 25-30° C.

The technical solutions of the present disclosure will be clearly and completely described below in conjunction with the examples of the present disclosure. Obviously, the described examples are only a part of, not all of the embodiments of the present disclosure. Based on the examples described in the present disclosure, all other embodiments obtained by those skilled in the art without making creative work shall fall within the protection scope of the present disclosure.

Example 1

(1) An egg shell was washed with water, dried at 80° C. for 6 h, crushed, and passed a 120-mesh sieve. The crushed egg shell that passing through the 120-mesh sieve was collected, and heated from ambient temperature to a calcination temperature of 1050° C. at a heating rate of 5° C./min, and calcinated at the calcination temperature for 1 h, then cooled to ambient temperature, ground, and passed a 120-mesh sieve to obtain a porous calcium oxide, which was the product passing through the 120-mesh sieve.

(2) 1.40 g of the porous calcium oxide was added into a three-necked flask, and 50 mL of methanol and 50 mL of ethanol were added thereto, and the resulting mixture was magnetically stirred under the protection of nitrogen gas and at a speed of 500 rpm for 30 min to obtain a calcium oxide heterogeneous solution.

(3) 5.94 g of nickel chloride hexahydrate ($NiCl_2 \cdot 6H_2O$), 75 mL of methanol and 75 mL of ethanol were mixed to be uniform under a stirring at 500 rpm to obtain a nickel source homogeneous solution.

(4) The nickel source homogeneous solution was added into the calcium oxide heterogeneous solution, and the resulting mixture was magnetically stirred for 4 h under the protection of nitrogen gas and at a speed of 500 rpm, and then centrifuged at 8000 rpm for 5 min to obtain a first solid product. The first solid product was washed with ethanol for 3 times, and then freeze-dried under vacuum at −53° C. for 8 h to obtain a nickel calcium hydroxide precursor (α-Ni(OH)$_2$/Ca(OH)$_2$).

(5) 0.50 g of the nickel calcium hydroxide precursor and 50 mL of a dilute hydrochloric acid with a concentration of 0.1 mol/L were mixed and magnetically stirred at 500 rpm for 30 min, then the resulting system was centrifuged at 8000 rpm for 5 min to obtain a second solid product. The second solid product was washed with deionized water for 3 times, and then freeze-dried under vacuum at −53° C. for 8 h, obtaining an α-Ni(OH)$_2$ having a porous two-dimensional structure.

Example 2

An α-Ni(OH)$_2$ was prepared according to the method of Example 1, except that the egg shell in step (1) was replaced by a clam shell.

Example 3

An α-Ni(OH)$_2$ was prepared according to the method of Example 1, except that the egg shell in step (1) was replaced by an oyster shell.

Example 4

An α-Ni(OH)$_2$ was prepared according to the method of Example 1, except that the solvent in steps (2) and (3) was methanol.

Comparative Example 1

This comparative example was performed according to the method of Example 1, except that the solvent in steps (2) and (3) was deionized water, and accordingly the nickel calcium hydroxide precursor obtained in step (4) was β-Ni(OH)$_2$/Ca(OH)$_2$, and a β-Ni(OH)$_2$ having a porous two-dimensional structure was obtained in step (5).

Comparative Example 2

This comparative example was performed according to the method of Example 1, except that the solvent in steps (2) and (3) was ethanol, and accordingly the nickel calcium hydroxide precursor obtained in step (4) was β-Ni(OH)$_2$/CaO, and a Ca(OH)$_2$ material was obtained in step (5).

An α-Ni(OH)$_2$ was prepared according to the method of Example 1, except that the magnetic stirring in steps (2) and (4) was performed in air.

FIG. 1 shows XRD patterns of α-Ni(OH)$_2$ prepared according to Example 1 (Mixture) and Example 4 (Methanol), β-Ni(OH)$_2$ nano material prepared according to Comparative Example 1 (Water), and Ca(OH)$_2$ prepared according to Comparative Example 2 (Ethanol). As can be seen from FIG. 1, the solvent has an effect on the phase of the product.

Figure 2:
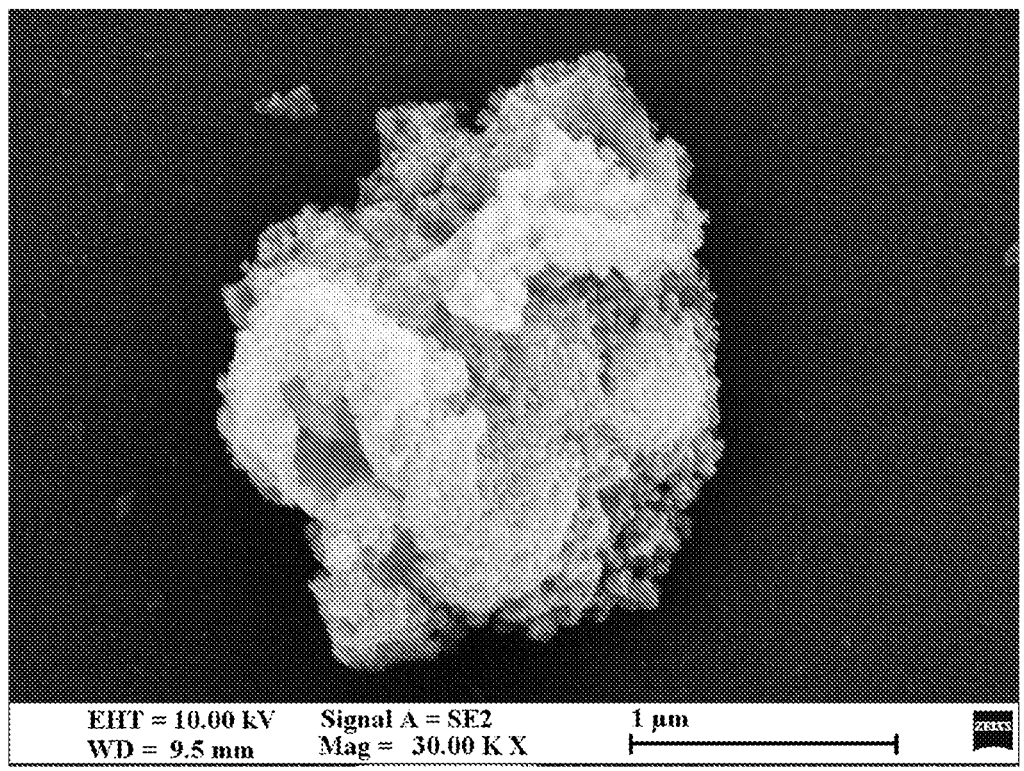
FIG. 2 is a scanning electron microscope (SEM) image of α-Ni(OH)$_2$ prepared according to Example 1.
Figure 3:
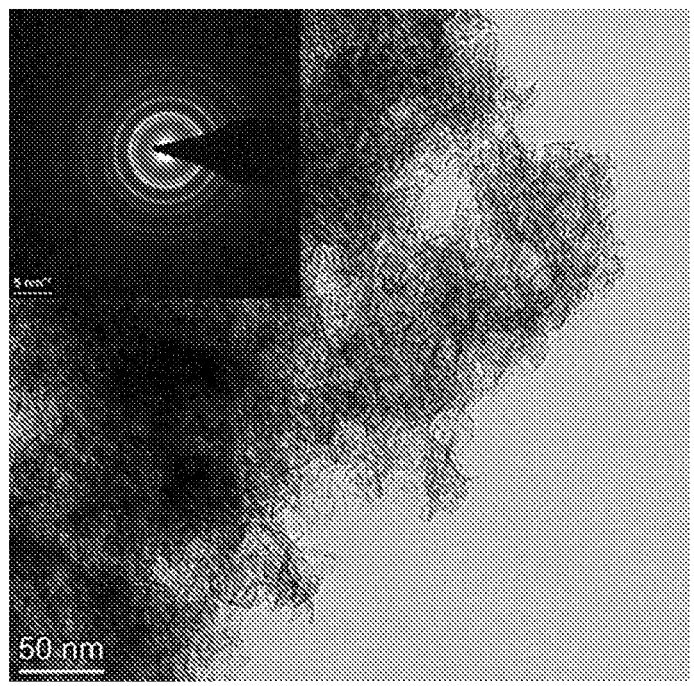
FIG. 3 is a transmission electron microscope (TEM) image of α-Ni(OH)$_2$ prepared according to Example 1.
Figure 4:
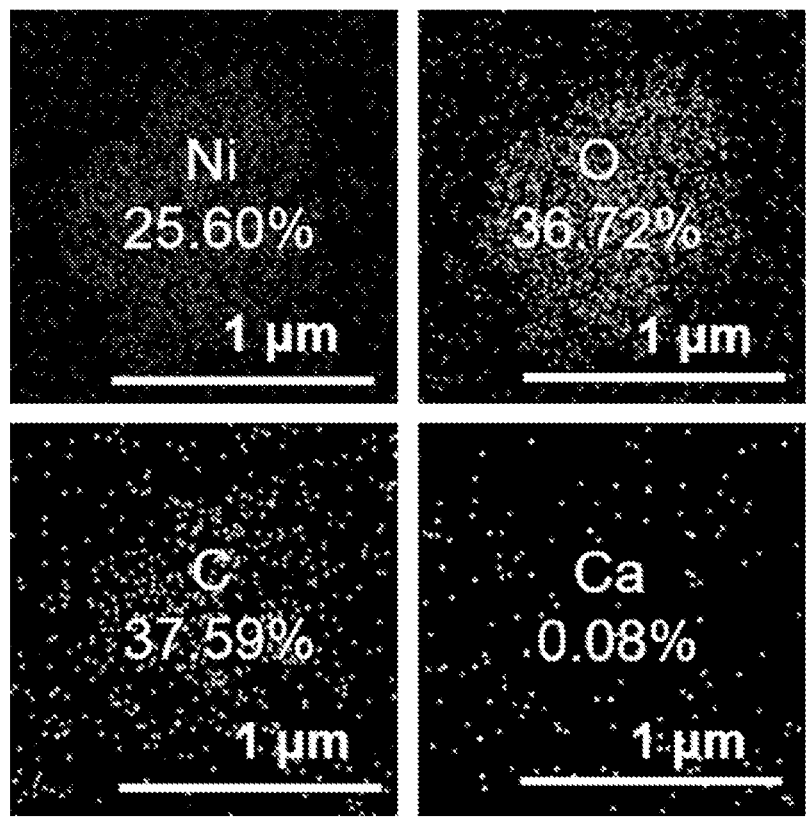
FIG. 4 shows energy dispersive X-Ray spectroscopy (EDX) of α-Ni(OH)$_2$ prepared according to Example 1.

FIG. 2 is an SEM image of α-Ni(OH)$_2$ prepared according to Example 1. FIG. 3 is a TEM photograph of α-Ni(OH)$_2$ prepared according to Example 1. FIG. 4 shows energy dispersive X-Ray spectroscopy of α-Ni(OH)$_2$ prepared according to Example 1.

Figure 5:
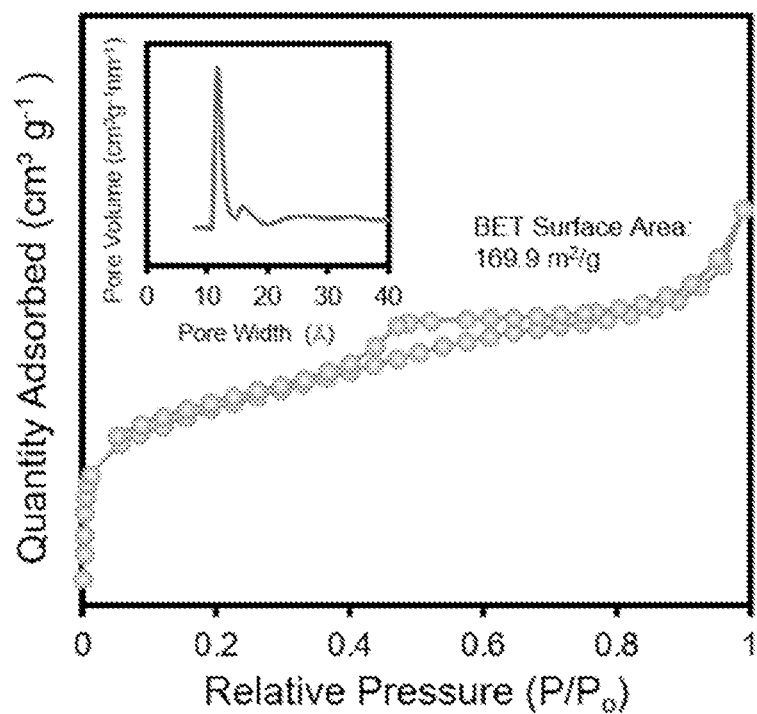
FIG. 5 shows $N_2$ adsorption-desorption curve (Brunauer-Emmett-Teller, BET) of α-Ni(OH)$_2$ prepared according to Example 1.

FIG. 5 shows N$_2$ adsorption-desorption curve of α-Ni(OH)$_2$ prepared according to Example 1. As can be seen from FIGS. 2 to 5, the α-Ni(OH)$_2$ prepared according to Example 1 has a porous structure formed by the accumulation of tiny nano sheets, and a uniform distribution of oxygen and nickel, indicating that the α-Ni(OH)$_2$ has good homogeneity. In addition, FIG. 5 illustrates that the α-Ni(OH)$_2$ has large specific surface area and small pore size, which further verifies that it has a porous structure.

Figure 6:
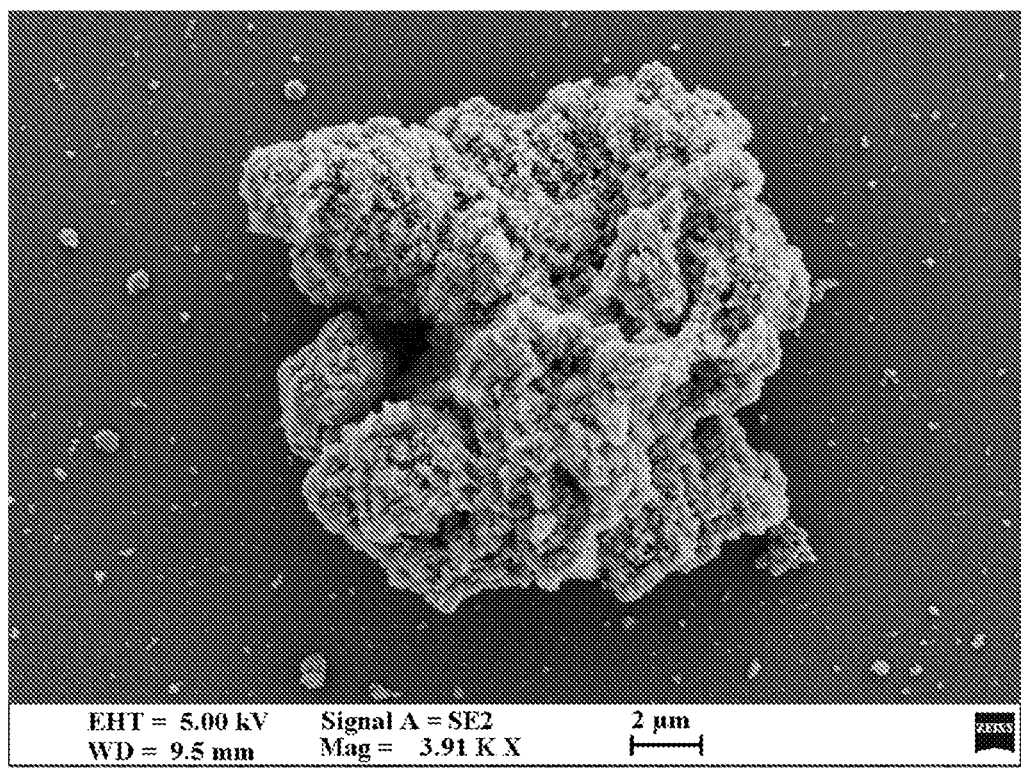
FIG. 6 is an SEM image of α-Ni(OH)$_2$ prepared according to Example 2.
Figure 7:
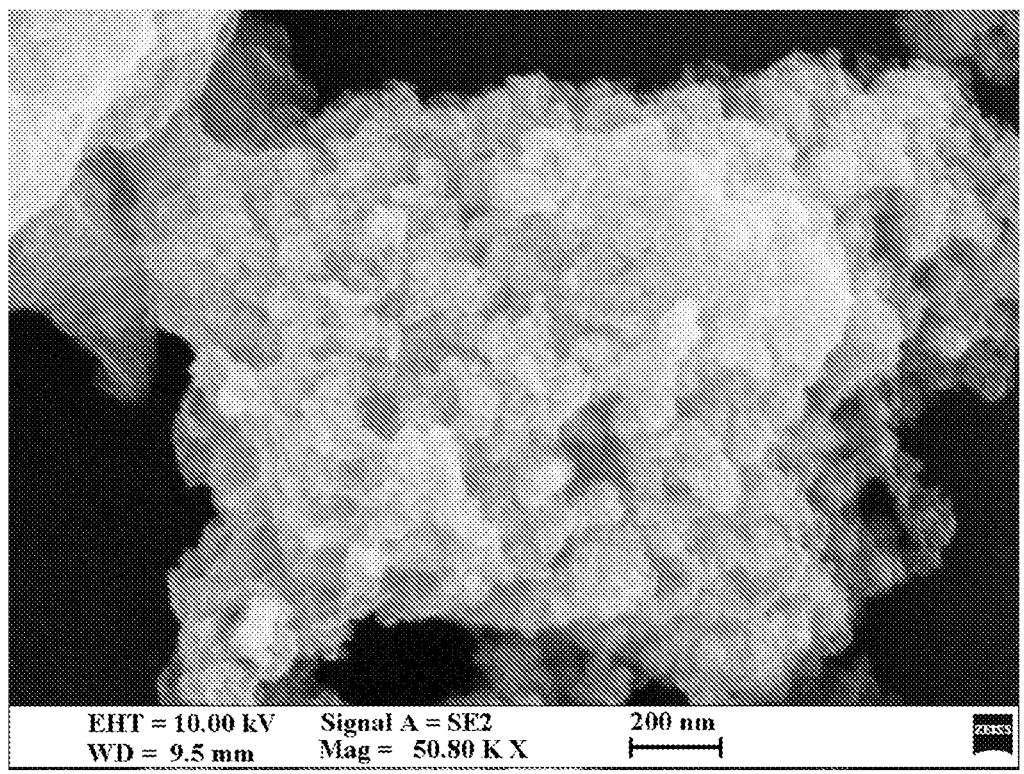
FIG. 7 is an SEM image of α-Ni(OH)$_2$ prepared according to Example 3.

FIG. 6 is an SEM image of α-Ni(OH)$_2$ prepared according to Example 2. FIG. 7 is an SEM image of α-Ni(OH)$_2$ prepared according to Example 3. As can be seen from FIGS. 6 to 7, α-Ni(OH)$_2$ could also be prepared by changing the type of biomass calcium source.

As can be seen from FIGS. 4, 5 and 7, the α-Ni(OH)$_2$ prepared according to the present disclosure has significantly large specific surface area, and the layered structure thereof remains unchanged.

Figure 8:
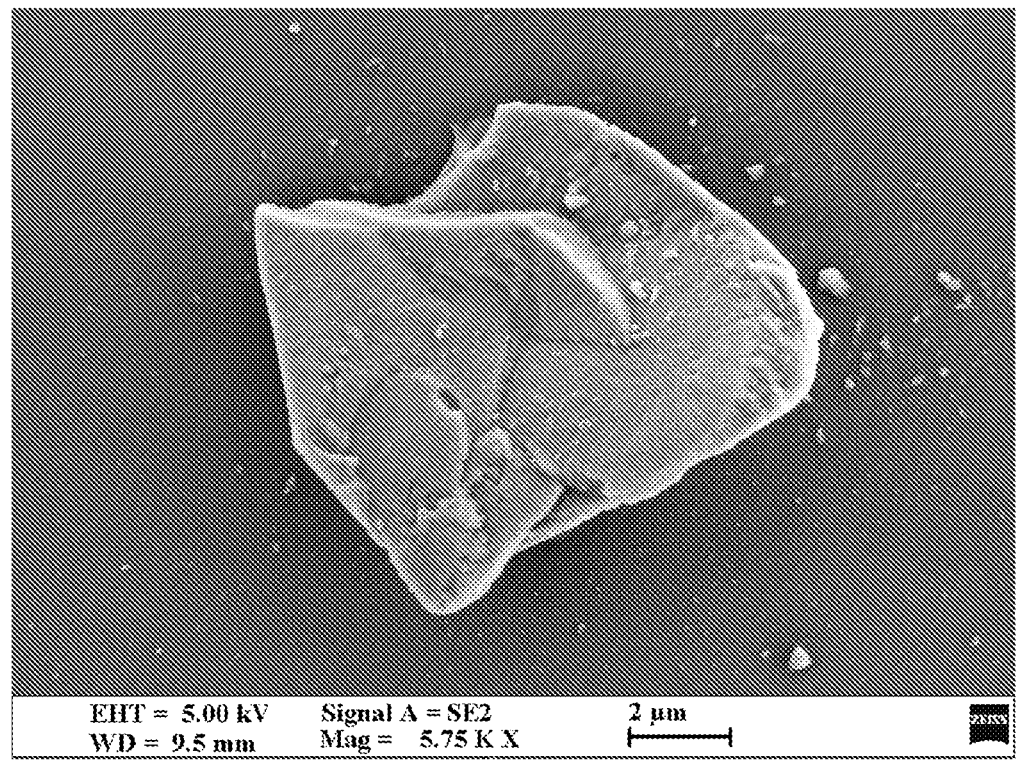
FIG. 8 is an SEM image of α-Ni(OH)$_2$ prepared according to Example 4.

FIG. 8 is an SEM image of α-Ni(OH)$_2$ prepared according to Example 4. As can be seen from FIG. 8, α-Ni(OH)$_2$ could also be prepared using a methanol alone as the solvent, but the morphology of the α-Ni(OH)$_2$ is different from that in Example 1. The α-Ni(OH)$_2$ prepared by using methanol as the solvent has a large-block structure with a smooth surface, while the α-Ni(OH)$_2$ prepared by using a mixed solvent of methanol and ethanol has a structure formed by stacking small nano sheets and with folds on the surface.

Figure 9:
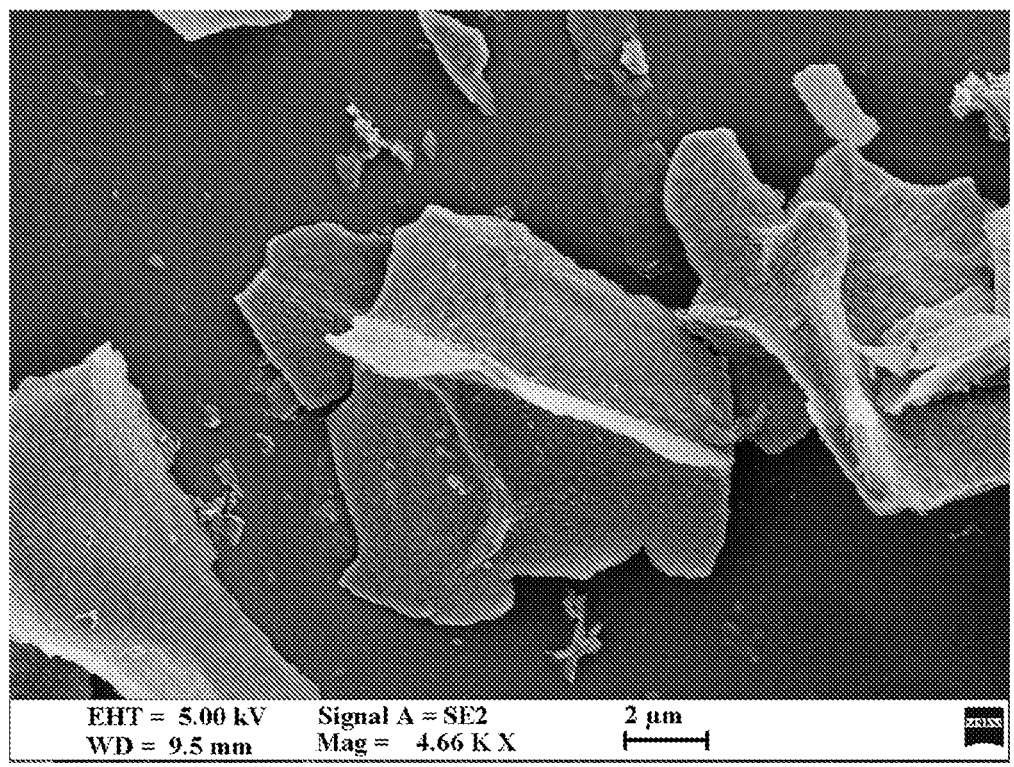
FIG. 9 is an SEM image of β-Ni(OH)$_2$ prepared according to Comparative Example 1.
Figure 10:
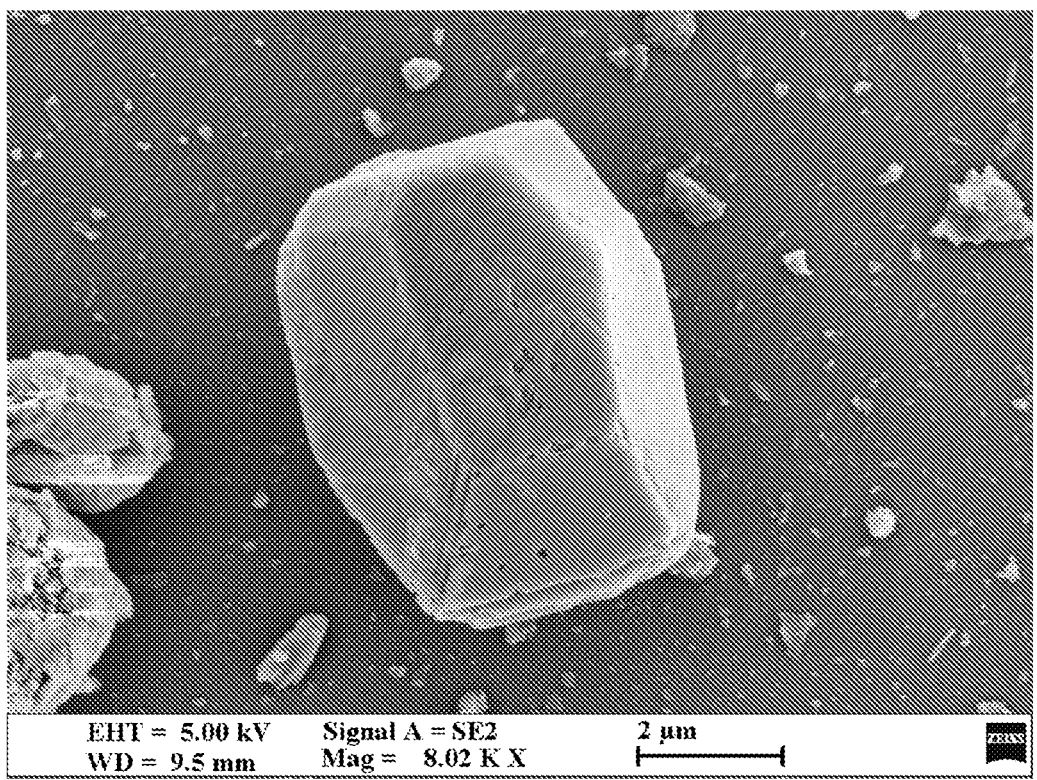
FIG. 10 is an SEM image of Ca(OH)$_2$ prepared according to Comparative Example 2.

FIG. 9 is an SEM image of β-Ni(OH)$_2$ prepared according to Comparative Example 1. FIG. 10 is an SEM image of Ca(OH)$_2$ prepared according to Comparative Example 2. As can be seen from FIGS. 9 and 10, the solvent has an effect on the phase and morphology of the product.

Use Example 1

The materials prepared according to Example 1, Example 4, Comparative Example 1 and Comparative Example 2 were used as a catalyst for the reduction of carbon dioxide.

1 mL of deionized water, 3 mL of acetonitrile and 1 mL of triethanolamine were added to a 25 mL quartz reactor, then 1.0 mg of catalyst and 8.0 mg of tris(2,2'-bipyridine) ruthenium(II) chloride hexahydrate were added thereto, and high-purity CO$_2$ (1 atm) was introduced into the quartz reactor. Then the quartz reactor was irradiated by a xenon lamp with a power of 300 W at 25° C., and carbon dioxide reduction reaction was conducted under a magnetic stirring. 0.5 mL of the generated gas was taken for gas chromatography. The results are shown in Tables 1 and 2, and FIGS. 11 and 12.

TABLE 1

Catalytic performance of the materials prepared according to Example 1, Example 4, Comparative Example 1 and Comparative Example 2

| Catalytic material | CO (μmol·h$^{-1}$·g$^{-1}$) | H$_2$ (μmol·h$^{-1}$·g$^{-1}$) | CO selectivity (%) |
|---|---|---|---|
| Example 1 | 22225 | 540 | 95.94 |
| Example 4 | 14370 | 735 | 95.13 |
| Comparative Example 1 | 12265 | 0 | 100 |
| Comparative Example 2 | 8855 | 480 | 94.86 |

Figure 11:
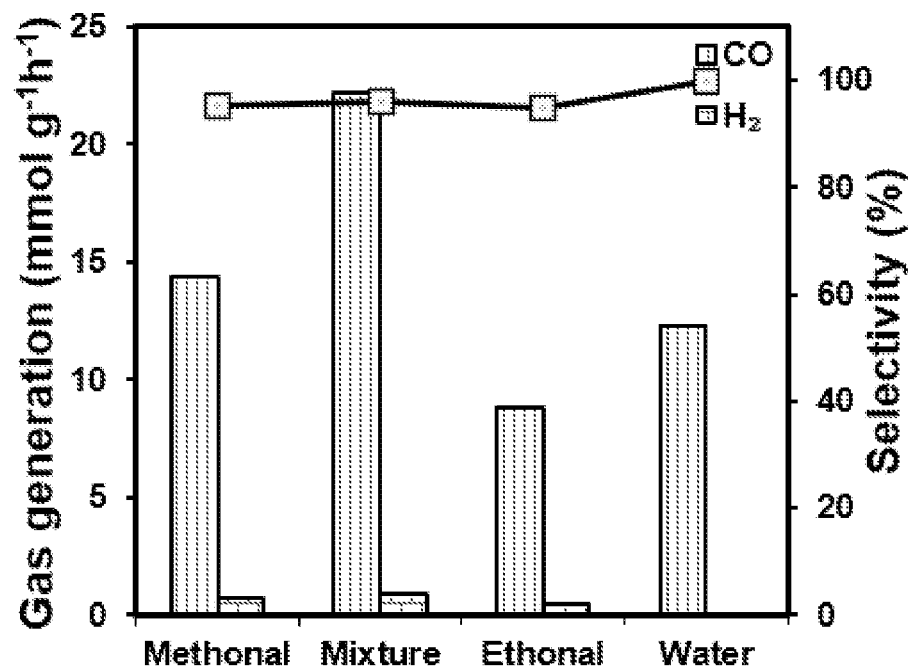
FIG. 11 shows the production of CO and $H_2$ under photocatalysis by α-Ni(OH)$_2$ prepared according to Example 1 (Mixture) and Example 4 (Methanol), β-Ni(OH)$_2$ nano material prepared according to Comparative Example 1 (Water), and Ca(OH)$_2$ prepared according to Comparative Example 2 (Ethanol) versus the reaction time.

FIG. 11 shows the production of CO and H$_2$ under photocatalysis by α-Ni(OH)$_2$ prepared according to Example 1 (Mixture) and Example 4 (Methanol), β-Ni(OH)$_2$ nano material prepared according to Comparative Example 1 (Water), and Ca(OH)$_2$ prepared according to Comparative Example 2 (Ethanol). As can be seen from FIG. 11 and Table 1, α-Ni(OH)$_2$ has the best photocatalytic activity, with the yield of CO up to 22225 μmol·h$^{-1}$·g$^{-1}$, which is 1.81 times that of β-Ni(OH)$_2$.

Use Example 2

The material prepared according to Example 1 was used as a catalyst to catalyze the reduction of carbon dioxide, and cyclic catalytic performance of the material was tested.

The test for catalytic performance was carried out according to the method of Use Example 1, except that the catalyst was used in an amount of 4 mg.

TABLE 2

The cyclic catalytic performance of α-Ni(OH)$_2$ prepared according to Example 1.

| Number of cycles | CO (mmol·h$^{-1}$·g$^{-1}$) | H$_2$ (mmol·h$^{-1}$·g$^{-1}$) | CO selectivity (%) |
|---|---|---|---|
| 1 | 18.97 | 0.32 | 98.34 |
| 2 | 18.30 | 0 | 100 |
| 3 | 17.67 | 0 | 100 |
| 4 | 17.85 | 0 | 100 |

Figure 12:
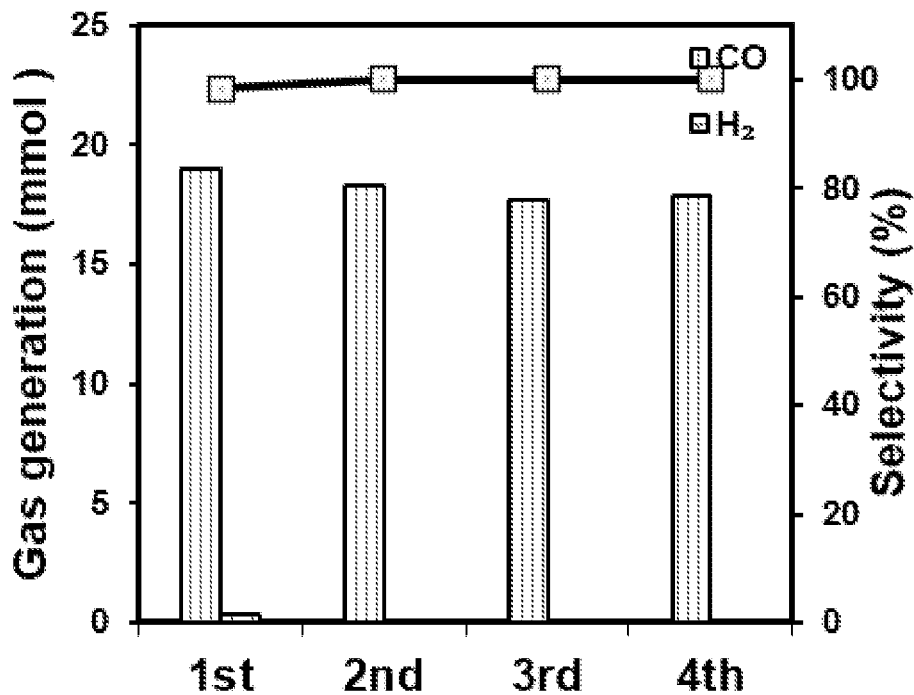
FIG. 12 shows the production of CO and $H_2$ under photocatalysis by α-Ni(OH)$_2$ prepared according to Example 1 at different photocatalytic cycles.

FIG. 12 shows the production of CO and H$_2$ under photocatalysis by α-Ni(OH)$_2$ prepared according to Example 1 at different photocatalytic cycles. As can be seen from FIG. 12 and Table 2, after four cycles, the performance loss of the α-Ni(OH)$_2$ prepared according to the present disclosure is basically negligible, indicating that the α-Ni(OH)$_2$ prepared according to the present disclosure has high stability in catalytic performance.

In summary, the α-Ni(OH)$_2$ prepared according to the present disclosure has good activity as a co-catalyst for photocatalytic reduction of CO$_2$ to obtain an efficient synthetic gas.

The foregoing descriptions are merely preferred embodiments of the present disclosure. It should be noted that those of ordinary skill in the art may make a number of improvements or refinements without departing from the principle of the present disclosure. These improvements or refinements shall also fall within the scope of the present disclosure.

What is claimed is:

1. A method for preparing an α-phase nickel hydroxide, comprising the following steps:
    subjecting a biomass calcium source to a calcination to obtain a porous calcium oxide;
    under a first protective atmosphere, mixing the porous calcium oxide with a first methanol-ethanol solvent to obtain a calcium oxide heterogeneous solution;
    under a second protective atmosphere, mixing the calcium oxide heterogeneous solution with a nickel source homogeneous solution to obtain a mixture, and subjecting the mixture to a coprecipitation to obtain a nickel calcium hydroxide precursor, wherein the nickel source homogeneous solution is prepared with a nickel source containing crystal water as a solute and a second methanol-ethanol solvent as a solvent; and
    subjecting the nickel calcium hydroxide precursor to a calcium hydroxide removal treatment to obtain the α-phase nickel hydroxide; wherein the calcium hydroxide is formed by hydration of the porous calcium oxide with crystal water in the nickel source;

wherein the first methanol-ethanol solvent and the second methanol-ethanol solvent independently have a volume ratio of methanol to ethanol of 1:0.1 to 1:10;

wherein the calcium hydroxide removal treatment comprises removing calcium hydroxide by using a dilute hydrochloric acid; and wherein a ratio of a mass of the nickel calcium hydroxide precursor to a number of moles of hydrochloric acid in the dilute hydrochloric acid is in a range of 1 g:(4-200) mmol.

2. The method of claim 1, wherein the biomass calcium source comprises one or more selected from the group consisting of oyster shell, clam shell and egg shell.

3. The method of claim 2, wherein the calcination is performed at a temperature of 900-1200° C. for 0.5-3 h.

4. The method of claim 1, wherein the calcination is performed at a temperature of 900-1200° C. for 0.5-3 h.

5. The method of claim 1, wherein a mass ratio of the porous calcium oxide to the nickel source containing crystal water is in a range of 1:0.1 to 1:250.

6. The method of claim 5, wherein the coprecipitation is performed under stirring at a speed of 500-1000 rpm for 1-48 h.

7. The method of claim 1, wherein the coprecipitation is performed under stirring at a speed of 500-1000 rpm for 1-48 h.

8. The method of claim 1, wherein the dilute hydrochloric acid has a hydrochloric acid concentration of 0.1-1 mol/L.

* * * * *